(12) United States Patent
Liao et al.

(10) Patent No.: US 10,299,046 B2
(45) Date of Patent: May 21, 2019

(54) MEMS MICROPHONE PACKAGE

(71) Applicant: LINGSEN PRECISION INDUSTRIES, LTD., Taichung (TW)

(72) Inventors: Hsien-Ken Liao, Taichung (TW);
Ming-Te Tu, Taichung (TW);
Jyong-Yue Tian, Taichung (TW);
Yao-Ting Yeh, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 15/335,742

(22) Filed: Oct. 27, 2016

(65) Prior Publication Data

US 2018/0063646 A1 Mar. 1, 2018

(30) Foreign Application Priority Data

Aug. 24, 2016 (TW) .............................. 105127066 A

(51) Int. Cl.
*H04R 25/00* (2006.01)
*H04R 19/04* (2006.01)
*B81B 7/00* (2006.01)
*H04R 1/04* (2006.01)
*B81C 1/00* (2006.01)

(52) U.S. Cl.
CPC ............. *H04R 19/04* (2013.01); *B81B 7/007* (2013.01); *B81C 1/0023* (2013.01); *H04R 1/04* (2013.01); *B81B 2201/0257* (2013.01); *B81B 2207/012* (2013.01); *B81B 2207/095* (2013.01); *H04R 2201/003* (2013.01)

(58) Field of Classification Search
CPC combination set(s) only.
See application file for complete search history.

(56) References Cited

U.S. PATENT DOCUMENTS

| 9,002,038 B2* | 4/2015 | Ochs ...................... H04R 23/00 |
| | | 381/174 |
| 9,156,680 B2* | 10/2015 | Kierse ..................... H01L 29/84 |
| 2011/0042762 A1* | 2/2011 | Laming ................. B81B 7/0077 |
| | | 257/416 |
| 2014/0117473 A1* | 5/2014 | Kierse ..................... H01L 29/84 |
| | | 257/416 |

* cited by examiner

*Primary Examiner* — Amir H Etesam
(74) *Attorney, Agent, or Firm* — Muncy, Geissler, Olds & Lowe, P.C.

(57) ABSTRACT

A MEMS microphone package includes a substrate including a base layer, a sound hole cut through opposing top and bottom surfaces of the base layer, a conduction part arranged on the base layer and a notch located on the top surface of the base layer, a sidewall connected with one end thereof to the top surface of the base layer and having a conducting line electrically connected to the conduction part, a cover plate connected to an opposite end of the sidewall and having a solder pad and a third contact disposed in conduction with the solder pad and electrically connected to the conducting line, a processor chip mounted in the notch and electrically connected to the conduction part, and an acoustic wave sensor mounted on the base layer to face toward the sound hole and electrically connected to the processor chip.

5 Claims, 2 Drawing Sheets

MEMS MICROPHONE PACKAGE

BACKGROUND OF THE INVENTION

1. Field of the Invention

The present invention relates to semiconductor packaging technology and more particularly, to a MEMS (microelectromechanical system) microphone package.

2. Description of the Related Art

MEMS is a technology that in its most general form can be defined as miniaturized mechanical and electro-mechanical elements (i.e., devices and structures) that are made using the techniques of micro fabrication. When compared with conventional electrets condenser microphones (ECM), MEMS microphones have the advantages of small package size, low power consumption and better environmental interference (such as temperature variation and electromagnetic interference) suppression ability. Therefore, the application of MEMS microphones in the field of acoustics will be more and more widespread.

In a conventional MEMS microphone 90, as illustrated in FIG. 2, the acoustic wave sensor 91 and the ASIC (Application-specific Integrated Circuit) 92 are electrically connected to the substrate 93 using wire bonding technology. Thus, the sidewall 94 that is mounted at the substrate 93 needs to provide a spare height H for accommodating the metal wire 95 so that the cover plate 96 can be connected to the sidewall 94 to complete the packaging process. However, since MEMS microphones have been widely used in smart phones, wire bonding is obviously inconsistent with the current market trend of low profile packaging.

Further, because the acoustic wave sensor 91 and the ASIC (Application-specific Integrated Circuit) 92 are disposed in the chamber 97 that is surrounded by the cover plate 96, the sidewall 94 and the substrate 93, the acoustic wave sensor 91 and the ASIC (Application-specific Integrated Circuit) 92 occupy a large space of the chamber 97. Thus, the back volume for enhancing the sensitivity of the acoustic wave sensor 91 is minimized, lowering the sensitivity of the acoustic wave sensor 91.

Therefore, it is desirable to provide a MEMS microphone that eliminates the drawbacks of the aforesaid prior art MEMS microphone design.

SUMMARY OF THE INVENTION

The present invention has been accomplished under the circumstances in view. It is the main object of the present invention to provide a MEMS microphone package, which has the advantages of low profile and high sensitivity.

To achieve this and other objects of the present invention, a MEMS microphone package comprises a substrate, a sidewall, a cover plate, a processor chip and an acoustic wave sensor. The substrate comprises a base layer defining a top surface and an opposing bottom surface, a sound hole cut through the opposing top and bottom surfaces of the base layer, a conduction part arranged on the base layer, and a notch located on the top surface of the base layer. The sidewall has one end thereof mounted at the top surface of the base layer, comprising a conducting line electrically connected to the conduction part. The cover plate is connected to an opposite end of the sidewall, defining with the sidewall and the base layer a chamber therein. The chamber is disposed in communication with the notch. Further, the cover plate comprises at least one solder pad, and a third contact in conduction with the at least one solder pad. The third contact is electrically connected to the conducting line. The processor chip is mounted in the notch, and electrically connected with the conduction part. The acoustic wave sensor is mounted on the base layer and electrically connected to the processor chip. Further, the acoustic wave sensor is disposed in the chamber to face toward the sound hole.

Preferably, the processor chip is electrically connected with the conduction part and the acoustic wave sensor using wire bonding technology. Thus, because the processor chip is mounted in the notch of the base layer without occupying any space of the chamber, the MEMS microphone package of the present invention can have a relatively larger back volume to enhance the sensitivity of the acoustic wave sensor. Further, the height of the metal wire between the processor chip and the acoustic wave sensor can be lowered and, the sidewall does not need to provide a spare height for accommodating the metal wire, and thus, the MEMS microphone package of the present invention has a low-profile characteristic.

Other advantages and features of the present invention will be fully understood by reference to the following specification in junction with the accompanying drawings, in which like reference signs denote like components of structure.

DETAILED DESCRIPTION OF THE INVENTION

Figure 1:
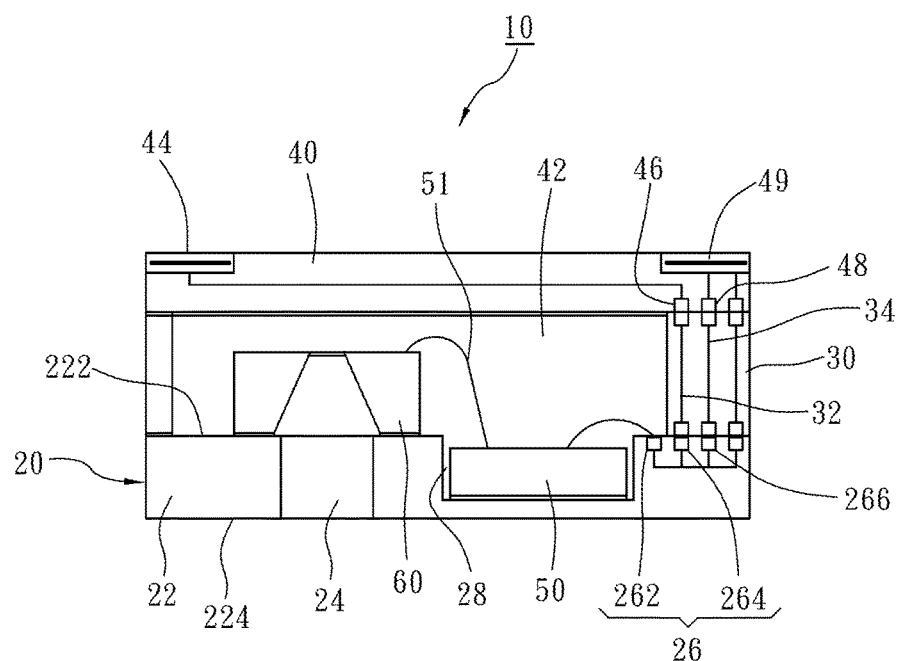
FIG. 1 is a sectional view of a MEMS microphone package in accordance with the present invention.

Referring to FIG. 1, a MEMS (micro-electromechanical system) microphone package 10 in accordance with the present invention is shown. The MEMS microphone package 10 comprises a substrate 20, a sidewall 30, a cover plate 40, a processor chip 50 and an acoustic wave sensor 60.

The substrate 20 comprises a base layer 22, a sound hole 24, a conduction part 26 and a notch 28. The base layer 22 defines a top surface 222 and an opposing bottom surface 224. The sound hole 24 cuts through the top surface 222 and bottom surface 224 of the base layer 22 for the passing of acoustic waves. The conduction part 26 is arranged on the base layer 22, comprising a first contact 262 and a second contact 264. The first contact 262 and the second contact 264 are disposed in conduction with each other. The notch 28 is located on the top surface 222 of the base layer 22.

The sidewall 30 has one end thereof mounted at the base layer 22, more specifically, the sidewall 30 has one end thereof mounted at the top surface 222 of the base layer 22. Further, the sidewall 30 comprises a conducting line 32 electrically connected to the second contact 264 of the conduction part 26.

Figure 2:
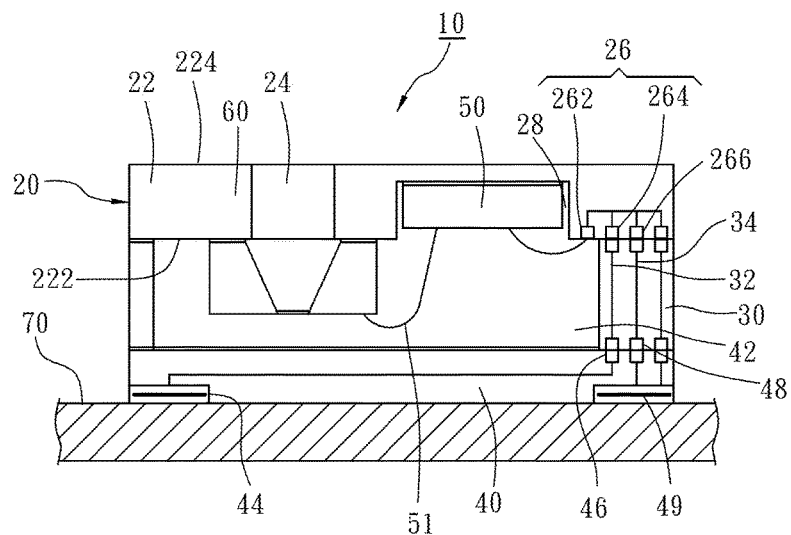
FIG. 2 is a sectional applied view of the present invention, illustrating the MEMS microphone package electrically coupled to an external circuit.
Figure 3:
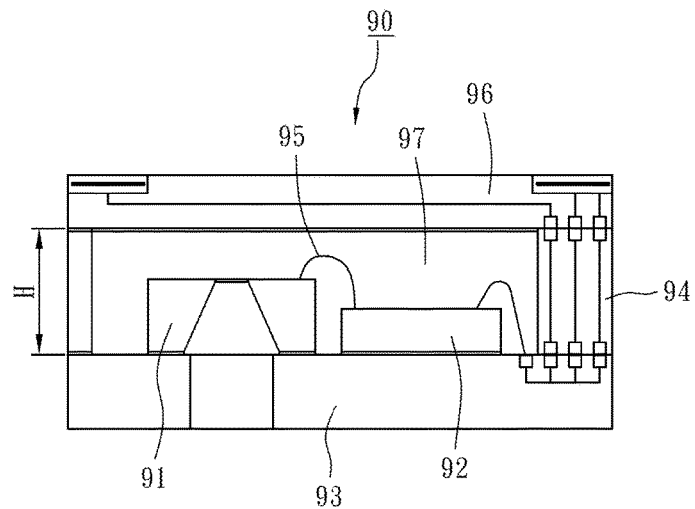
FIG. 3 is a sectional view of a MEMS microphone according to the prior art.

The cover plate 40 can be a metal substrate, fiberglass substrate or ceramic substrate. The cover plate 40 is connected to an opposite end of the sidewall 30, defining a chamber 42 that is surrounded by the cover plate 40, the sidewall 30 and the base layer 22 and disposed in communication with the notch 28. Further, the cover plate 40 comprises a first solder pad 44 and a third contact 46 in conduction with the first solder pad 44. The third contact 46 is electrically connected to the conducting line 32 of the sidewall 30. The quantity of the first solder pad 44 in other embodiments can be plurality. As shown in FIGS. 1 and 2, the conduction part 26 further includes a fourth contact 266 electrically connected with a second conducting line 34 of the sidewall 30. The second conducting line 34 is electrically connected with a fifth contact 48 of the cover plate 40. The fifth contact 48 is electrically connected with a second solder pad 49 of the cover plate 40.

In other embodiments, the quantity of the second contact 264, the third contact 46 and the conducting line 32 can be the same plurality and respectively electrically connected, for example, three conducting lines 32 are respectively electrically connected to respective three second contacts 264 and respective three third contacts 46.

The processor chip 50 is mounted in the notch 28 and electrically connected with the conduction part 26, more specifically, the processor chip 50 is electrically connected with the first contact 262 of the conduction part 26 using flip-chip technology. In the present preferred embodiment, the processor chip 50 is an application-specific integrated circuit (ASIC) designed and manufactured according to specific user needs for use in specific electronic systems. The processor chip 50 can have a charge pump, a voltage regulator, an amplifier, a sigma delta modulator and a digital-to-analog converter integrated therein, providing small size, improved performance and noise suppression characteristics.

The acoustic wave sensor 60 is mounted on the top surface 222 of base layer 22, and electrically connected to the processor chip 50, more specifically, the acoustic wave sensor 60 is electrically connected to the processor chip 50 using wire bonding technology. The acoustic wave sensor 60 is disposed in the chamber 42 to face toward the sound hole 24 for receiving external acoustic wave signals. In this embodiment, the acoustic wave sensor 60 is capable of converting an external acoustic wave signal to an electrical signal for transmission through the processor chip 50 for further processing.

Referring to FIG. 2 again, in application of the MEMS microphone package 10, the MEMS microphone package 10 shown in FIG. 1 is turned upside down to keep the cover plate 40 facing down and the substrate 20 facing up. The acoustic wave sensor 60 can receive an external acoustic wave signal through the sound hole 21 and converts the received acoustic wave signal to an electrical signal, and then transmits the electrical signal to the processor chip 50 for processing. After the processing process, the processor chip 50 transmits the processed signal properly through the conduction part 26, the conducting line 32 and the third contact 46 to the at least one solder pad 44 for use by an external circuit 70.

As stated above, because the processor chip 50 is mounted in the notch 28 of the base layer 22 without occupying any space of the chamber 42, the MEMS microphone package 10 of the present invention can have a relatively larger back volume to enhance the sensitivity of the acoustic wave sensor 60. Further, the height of the metal wire 51 between the processor chip 50 and the acoustic wave sensor 60 can be lowered and, the sidewall 30 does not need to provide a spare height for accommodating the metal wire 51, and thus, the MEMS microphone package 10 of the present invention has a low-profile characteristic.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A MEMS microphone package, comprising:
a substrate comprising a base layer defining a top surface and an opposing bottom surface, a sound hole cut through the opposing top and bottom surfaces of said base layer, a conduction part arranged on said base layer and a notch located on said top surface of said base layer, said conduction part having a first contact, a second contact and a fourth contact;
a sidewall having one end thereof mounted at said top surface of said base layer, said sidewall comprising a first conducting line electrically connected to said conduct contact of said conduction part, and a second conducting line;
a cover plate connected to an opposite end of said sidewall and defining with said sidewall and said base layer a chamber therein, said chamber being disposed in communication with said notch, said cover plate comprising a first solder pad, a second solder pad, and a third contact in conduction with said first solder pad, and a fifth contact in conduction with said second solder pad, said third contact being electrically connected to said first conducting line, and one end of said second conducting line being electrically connected to said fourth contact, and the other end of said second conducting line being electrically connected to said fifth contact;
a processor chip mounted in said notch and electrically connected with said first contact of said conduction part; and
an acoustic wave sensor mounted on said base layer and electrically connected to said processor chip, said acoustic wave sensor being disposed in said chamber to face toward said sound hole;
wherein said conducting line is buried in said sidewall and both ends of said conducting line are exposed on upper and lower sides of said sidewall.

2. The MEMS microphone package as claimed in claim 1, wherein said processor chip is electrically connected with said conduction part and said acoustic wave sensor using wire bonding technology.

3. The MEMS microphone package as claimed in claim 1, wherein said cover plate is selectively made of a metal substrate, fiberglass substrate or ceramic substrate.

4. The MEMS microphone package as claimed in claim 1, wherein said processor chip is an application-specific integrated circuit (ASIC).

5. The MEMS microphone package as claimed in claim 2, wherein said processor chip is an application-specific integrated circuit (ASIC).

* * * * *